(12) United States Patent
Liu et al.

(10) Patent No.: US 8,138,062 B2
(45) Date of Patent: Mar. 20, 2012

(54) ELECTRICAL COUPLING OF WAFER STRUCTURES

(75) Inventors: Lianjun Liu, Chandler, AZ (US); Lisa H. Karlin, Chandler, AZ (US); Alan J. Magnus, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 83 days.

(21) Appl. No.: 12/638,424

(22) Filed: Dec. 15, 2009

(65) Prior Publication Data

US 2011/0143476 A1 Jun. 16, 2011

(51) Int. Cl.
*H01L 21/30* (2006.01)
(52) U.S. Cl. ............... 438/455; 438/464; 257/E21.499; 257/E23.128
(58) Field of Classification Search ............ 438/51, 438/455, 464; 257/E21.499, E23.128
See application file for complete search history.

(56) References Cited

U.S. PATENT DOCUMENTS

| | | | |
|---|---|---|---|
| 5,668,033 A | 9/1997 | Ohara et al. | |
| 6,846,725 B2 | 1/2005 | Nagarajan et al. | |
| 7,034,393 B2 | 4/2006 | Alie et al. | |
| 2004/0166662 A1 | 8/2004 | Lei | |
| 2006/0001114 A1* | 1/2006 | Chen et al. | 257/415 |
| 2006/0273430 A1 | 12/2006 | Hua et al. | |
| 2007/0161210 A1* | 7/2007 | Shao et al. | 438/455 |
| 2008/0191334 A1 | 8/2008 | Lee et al. | |

OTHER PUBLICATIONS

PCT/US2010/057624 International Search Report and Written Opinion mailed Jul. 14, 2011.

* cited by examiner

*Primary Examiner* — Michael Lebentritt
*Assistant Examiner* — Daniel Whalen
(74) *Attorney, Agent, or Firm* — David G. Dolezal; Ranjeev Singh (57) ABSTRACT

A method for electrically coupling a first wafer with a second wafer is provided. The method includes bonding the first wafer with the second wafer using a bonding material. The method further includes forming an opening in the first wafer in a scribe area of the second wafer to expose a surface of a conductive structure of the second wafer. The method further includes forming a conductive layer overlying the first wafer and the opening in the first wafer such that the conductive layer forms an electrical contact with the conductive structure of the second wafer thereby electrically coupling the first wafer with the second wafer.

20 Claims, 6 Drawing Sheets

ELECTRICAL COUPLING OF WAFER STRUCTURES

BACKGROUND OF THE INVENTION

1. Field of the Invention

This invention relates in general to semiconductor devices and in particular to the electrical coupling of structures of two wafers.

2. Description of the Related Art

Some semiconductor devices such as a MEMS semiconductor devices utilize cap wafers for providing a protective cavity for the MEMS device during operation. A MEMS device is a micro-electrical mechanical device that is typically manufactured, in some embodiments, with semiconductor device processes. Examples of MEMS devices include accelerometers, sensors, micro motors, and switches. In some examples, MEMS devices include parts (e.g. proof masses) that move during operation. Because of this movement, a cavity is used to protect the part while allowing for movement of the part.

A cavity can be implemented by forming an opening in a cap wafer and bonding the cap wafer to the device wafer where the opening overlies the MEMS device. Afterwards, the cap wafer and device wafer are singulated to form the MEMS die.

One problem with implementing a cap wafer in some examples is that a good grounding coupling with the device wafer is needed. In some examples, the grounding coupling is made with wire bonds from the cap wafer to the device wafer, conductive vias through the cap wafer to the device wafer, or conductive bonding material between the cap wafer and the device wafer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale. For example, the width to height ratios of the structures shown in the Figures may be skewed in order to more clearly illustrate aspects of the present invention.

DETAILED DESCRIPTION

The following sets forth a detailed description of a mode for carrying out the invention. The description is intended to be illustrative of the invention and should not be taken to be limiting.

As described herein, in one embodiment, an electrical coupling from a cap wafer structure to a device wafer structure is made by forming an opening in the cap wafer in a scribe area to a conductive structure of the device wafer and then forming a conductive layer over the cap wafer including in the opening and on the sidewalls of the opening, where the conductive layer contacts the conductive structure of the device wafer. Afterwards, the cap and device wafers are singulated in the scribe area such that conductive material on the opening sidewalls remains for electrically coupling the cap wafer structure and the device wafer structure.

Figure 1:
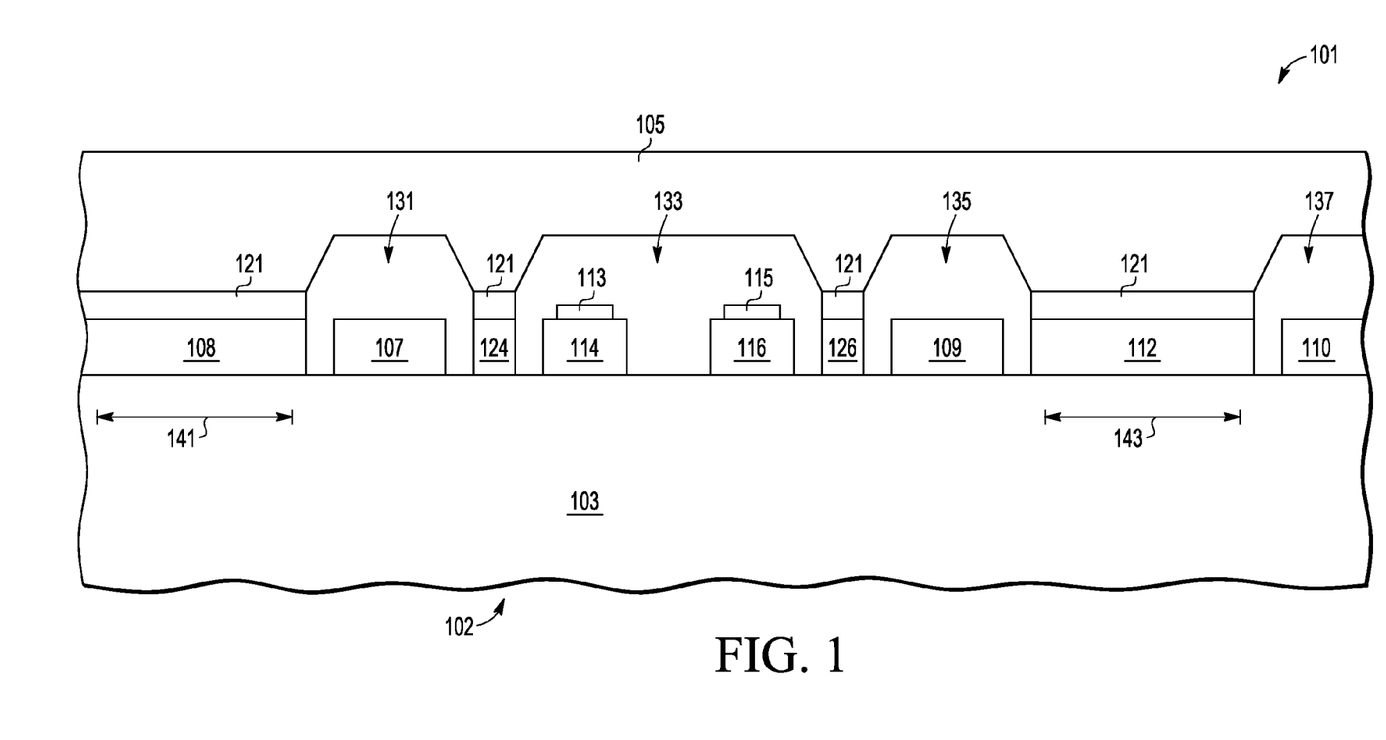
FIGS. 1-6 set forth views of various stages in the manufacture of a semiconductor device having a cap wafer structure according to an embodiment of the present invention.

FIG. 1 is a partial cross sectional side view of a resultant wafer 101 that includes a device wafer 102 bonded to the cap wafer 105 with a bonding material 121. In one embodiment, bonding material 121 is a glass frit that is non conductive. However, in other embodiments, other types of bonding material such as a conductive glass frit (e.g. with a conductive material such as lead) or solder may be used. In one embodiment, the wafers are bonded together under temperature and pressure for a period of time to provide for a mechanically solid bond between the two wafers. In one embodiment, the bond is a hermetic bond.

Device wafer 102 includes a number of semiconductor devices (107, 109, 110) located on substrate 103 that were formed prior to the bonding of wafer 102 with wafer 105. In one embodiment, these devices include structures made of semiconductor, conductive, and/or dielectric material formed by semiconductor manufacturing processes. Devices 107, 109, and 110 may include multiple layers of different materials that have been processed to form different structures. In one embodiment, devices 107, 109, and 110 are multi axis accelerometers but in other embodiments, devices 107, 109, and 110 may be other types of MEMS devices such as other types of accelerometers, sensors, motors, or switches. Also, in other embodiments, devices 107, 109, and 110 may be other types of semiconductor devices such as integrated circuits, stand alone devices, or sensors. In one embodiment, devices 107, 109, and 110 are formed by forming and processing different layers on substrate 103.

Wafer 102 includes pads (113 and 115) for externally coupling devices 107, 109, and 110 to external devices (e.g. on integrated circuit die) to convey signals to those external devices. Pads 113 and 115 are made of a conductive material (e.g. copper, aluminum, gold) that in one embodiment is wire bondable. Pads 113 and 115 are located on and in electrical contact with poly silicon structures 114 and 116 respectively. In one embodiment, substrate 103 includes multiple conductive structures (not shown) for electrically coupling conductive structures of the semiconductor devices (107, 109, and 110) with pad support structures (114 and 116). For example, device 107 is electrically coupled to structure 114 and device 109 is electrically coupled to structure 116.

In one embodiment, substrate 103 includes a semiconductive material e.g. silicon with conductive structures and dielectric structures located in layers therein. In some embodiments, portions of the semiconductor material are selectively doped to be conductive. However, wafer 102 may have other configurations in other embodiments.

Device wafer 102 includes scribe conductive structures 108 and 112 that include portions located in scribe areas 141 and 143. A scribe area is an area of a wafer that is located between device areas of the wafer that will separated during singulation and includes a separation path. Structures 108 and 112 are made of a conductive material such as poly silicon or a metal. Each scribe structure (108 and 112) is electrically coupled to two devices (of devices 107, 109, and 110) by electrically conductive structures (not shown) located in substrate 103. For example, conductive structure 112 is electrically coupled to device 109 and device 110.

Wafer 102 also includes conductive structures 124 and 126 that are located between the devices and the pad areas for bonding the cap wafer to provide a seal for devices 107 and 109.

In one embodiment, cap wafer 105 is made of a semiconductor material (e.g. silicon) and includes openings 131, 133, 135, and 137 (e.g. formed by etching) for forming cavities for the structures of device wafer 102. In one embodiment, after wafer 105 is attached to wafer 102, the top side of wafer 105 is ground and polished to reduce the thickness of wafer 105. In one embodiment, wafer 105 is ground to a reduced thickness in the range of 100-400 µm. However, in other embodiments, the cap may be ground to other thicknesses or may not be ground at all. In some embodiments, cap wafer 105 may include devices such as MEMS devices or other semiconductor devices formed thereon. In one embodiment, wafer 105 does not include openings 131, 133, 135, and 137.

Figure 2:
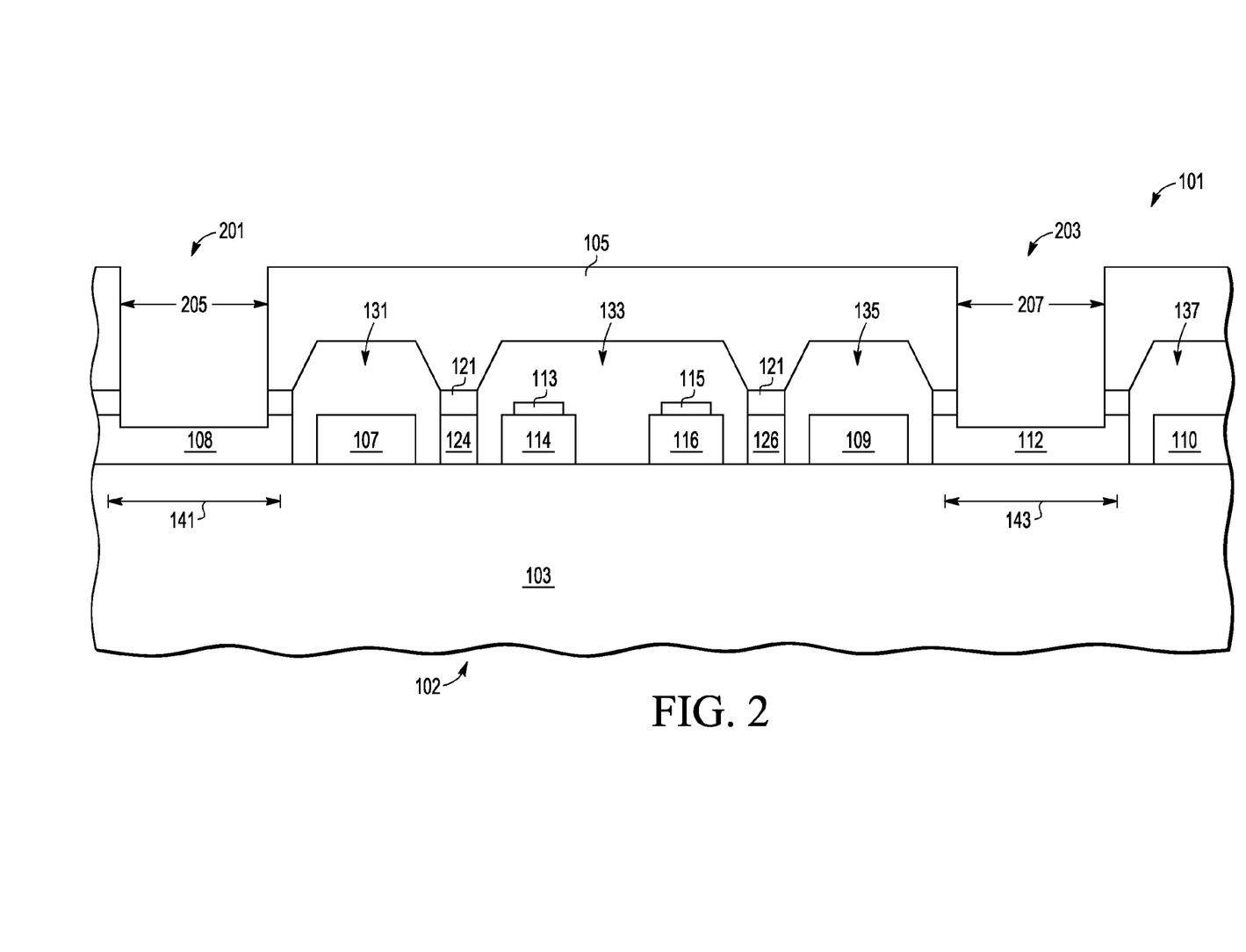

FIG. 2 is a partial cross sectional side view of resultant wafer 101 after openings (201 and 203) are made in wafer 105 to expose conductive structures (108 and 112) in scribe areas of wafer 102. In one embodiment, the openings are made to a depth to ensure that wafer 105 and bonding material 121 are removed from locations over structures 108 and 112 to expose the conductive structures. Such a cut may include removing a top portion of structures 108 and 112. In one embodiment, the openings are formed with a saw. In the embodiment shown, openings 201 and 203 have widths 205 and 207 of 80 microns, but may be of other widths in other embodiments.

In other embodiments, bonding material 121 would not be formed in the areas of openings 201 and 203. In these areas, there would be a void between the cap wafer 105 and scribe conductive structures (108 and 112). However, forming bonding material in these areas may provide for a flush sidewall of the openings, as bonding material is located between the scribe conductive structure (108 and 112) and cap wafer 105. A flush side wall provides for a better subsequently formed of a conductive layer on the sidewall.

In other embodiments, openings 201 and 203 may be formed by other methods such as by a double saw cut, by laser, or by etching.

Figure 3:
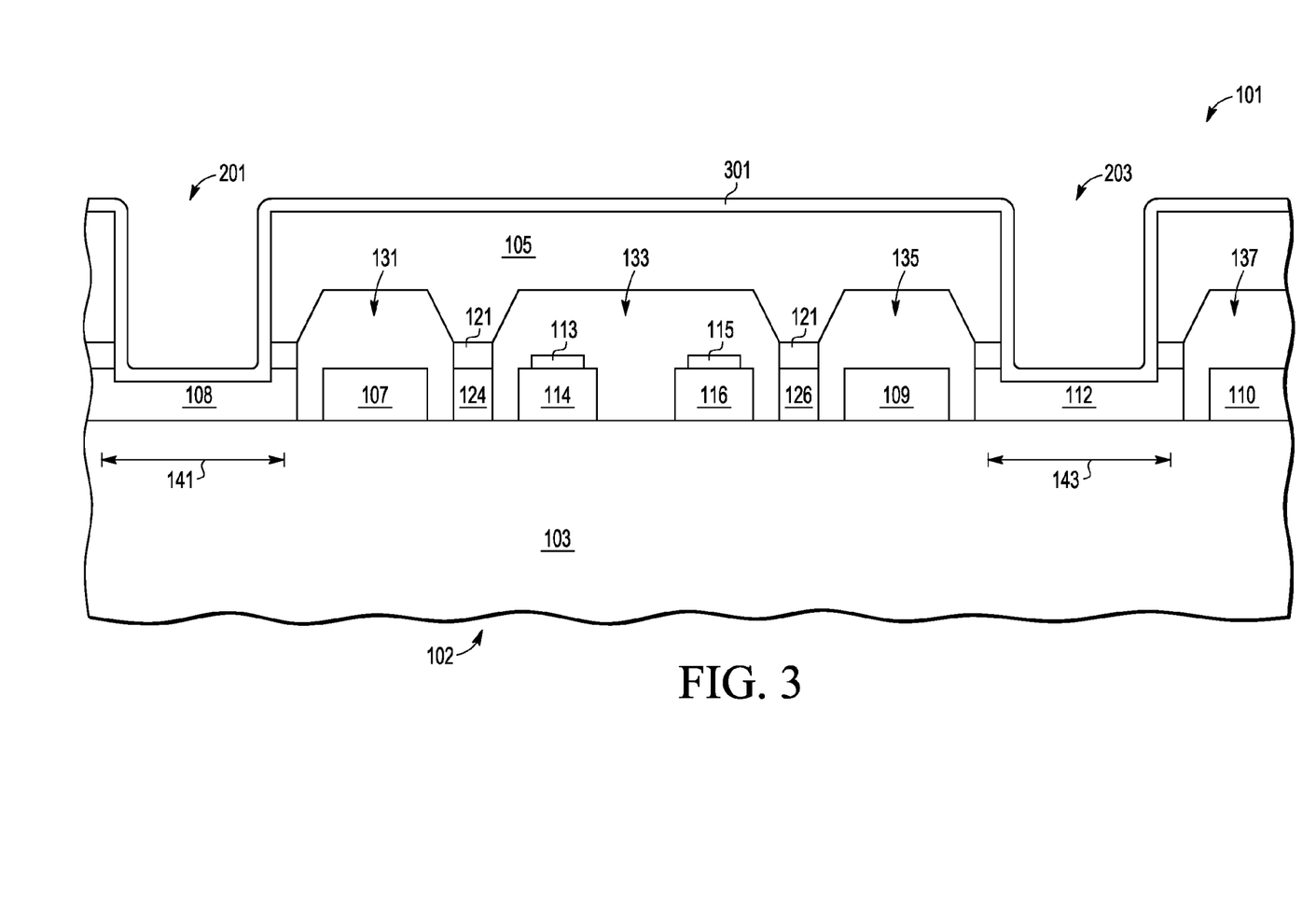

FIG. 3 is a partial cross sectional side view of resultant wafer 101 after a conductive layer 301 is formed over wafer 101. In one embodiment, layer 301 is made of a metal (e.g. copper aluminum, or gold). In one embodiment, layer has a thickness of 2 microns, but may have other thicknesses in other embodiments. Layer 301 is formed to have good step coverage on the sidewalls of openings 201 and 203 to provide a path for good electrical conductivity. In one embodiment, layer 301 is formed by a metal deposition process such as a chemical vapor deposition process, a physical vapor deposition process, an electroplating process, or other metal forming process. In one embodiment, layer 301 may include multiple layers of different materials.

Figure 4:
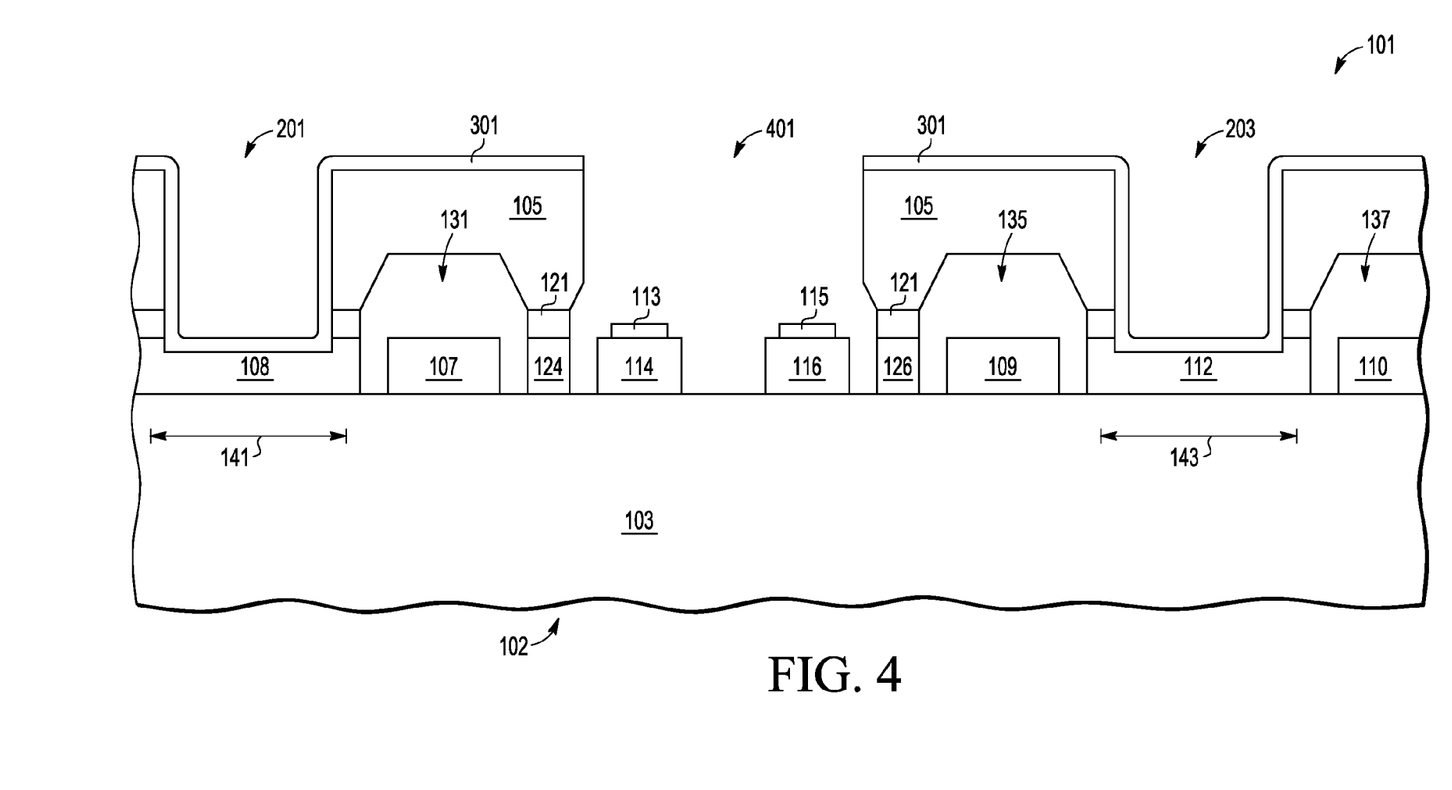

FIG. 4 is a partial cross sectional side view of resultant wafer 101 after openings (401) are formed over the pads (113 and 115) to expose the pads for subsequent testing. In one embodiment, opening 401 is made with a double saw cut, but could be made by other methods in other embodiments (e.g. such as etching). After forming the openings, wafer 101 is subjected to cleaning processes such as ashing to remove unwanted organic materials. Afterwards, the devices (107, 109, and 110) are tested for operability using test probes that contact the exposed pads (113 and 115).

Figure 5:
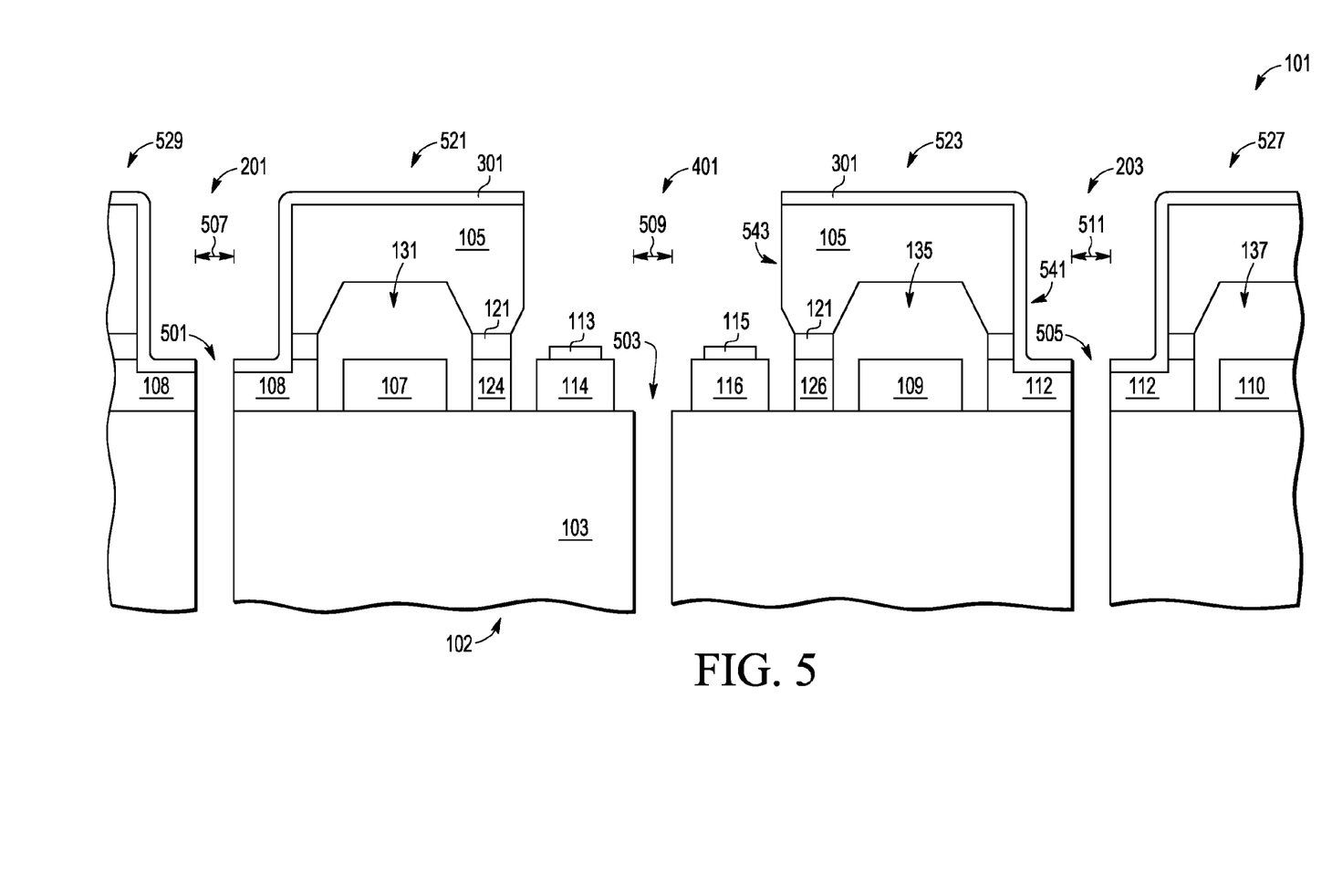

FIG. 5 is a partial cross sectional side view after resultant wafer 101 is singulated into separate die (529, 521, 523, and 527). In one embodiment, singulation is achieved by cutting wafer 101 in the scribe areas (141 and 143) and between the pads (e.g. 114 and 116). In one embodiment, the wafer is cut with a saw, laser, or other wafer cutting tool. In other embodiments, singulation can be performed by etching wafer 101 in the scribe areas. Each die (529, 521, 523, and 527) includes a semiconductor device (107, 109, and 110) located in a cavity (formed from openings 131, 135, and 137). In one embodiment, these cavities are hermetically sealed when wafer 102 was bonded to wafer 105.

In the embodiment shown, the saw paths (501, 503, and 515) have widths (507, 509, and 511) that are approximately 40-50 microns wide, but can be of other widths in other embodiments. The widths (507, 509, and 511) of these saw paths are less than the widths (205 and 207) of the previously formed openings (201 and 203). Accordingly, portions of layer 301 remain on the sides of openings 201 and 203 to provide for a electrically conductive path for electrically coupling the portions of wafer 105 for each die with its corresponding electrically conductive scribe structure (108, 112) remaining after singulation.

In the embodiment shown, the remaining portions of the scribe conductive structures (112, 108) form a seal ring along with conductive structures such as structures 124 and 126 for sealing the cavity of each die.

Figure 6:
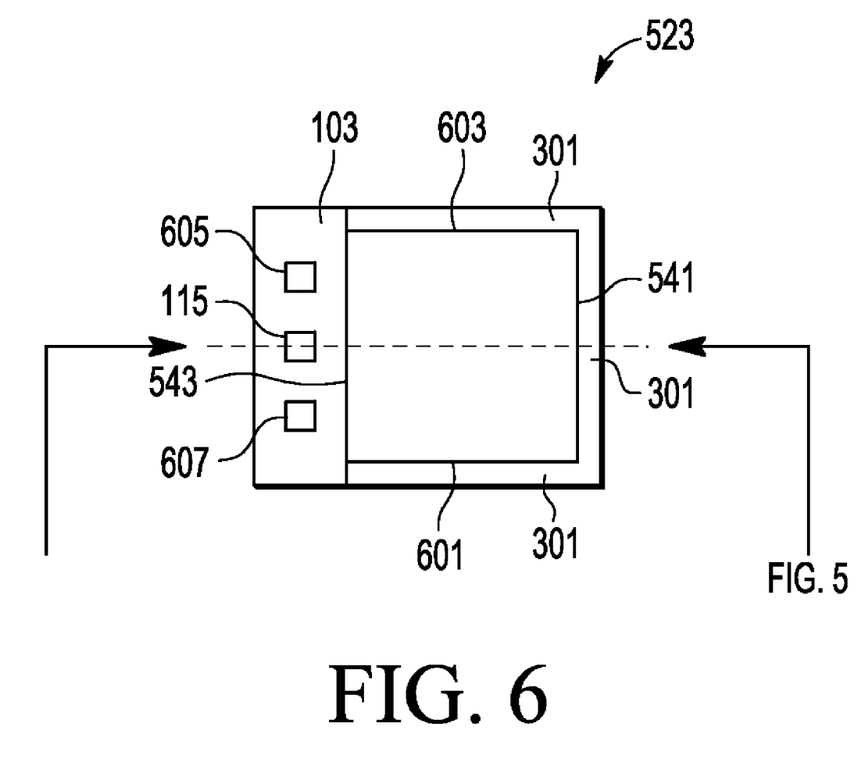

FIG. 6 is a top view of die 523 after singulation. In the embodiment shown, layer 301 covers all of the top of die 523 except for that portion formed by opening 401 that exposes pads 115, 605, and 607. In the embodiment shown, layer 301 covers three side walls (541, 603, and 601) that were formed by the openings (e.g. 201 and 203) over the scribe areas. Consequently, for the embodiment shown, the there is a relatively large amount of conductive material coupling the two wafer portions together. In other embodiments, the shape and coverage of layer 301 may be different. For example, it may only cover part of the side walls of the cap wafer structure or cover all four sides of the cap wafer structure. Also, there may be an opening in the top side of layer 301 for other external conductors.

The resultant die can then be further packaged (e.g. in encapulant) either by itself or with other integrated circuit die. Layer 301 may be electrically coupled to a grounding terminal of the package. The resultant package can then be utilized in various electronic systems.

Providing an electrical connection between two bonded wafers that includes forming an opening in a scribe area and then forming a conductive layer plating the opening may provide for a more efficient and reliable electrical coupling between two wafers than with other conventional techniques. Because the electrical coupling of the two wafers is made with an eclectically conductive layer, the wafer bonding material 121 can be chosen for its bonding properties and without regard to its electrical conductivity properties.

Also, with such embodiments, wire bonds are not needed for the ground coupling between the two wafers. This may also reduce the total height of a subsequent package in that cap wafer grounding wire bonds are typically made to the top surface of the cap wafer.

Furthermore, forming a conductive layer on the side wall of a relatively large opening is technically easier than forming conductive vias through relatively smaller openings in a cap wafer. Also, because layer 301 can be configured to cover a large portion of the scribe area surrounding a die (e.g. 3 sides as shown in FIG. 6), interior device area is not needed as with wire bonding or via formation. Furthermore, multiple wire bonds and conductive vias would be needed to get the same amount of conductive material as located on the sidewalls of the cap wafer structure for electrically coupling the wafers.

In other embodiments, the initial scribe openings (201 and 203) could be made from the bottom of the device wafer 102 to expose conductive surfaces of the cap wafer 105. The conductive layer 301 would then be formed on the bottom side of device wafer 102 and would extend in the openings to contact the exposed conductive surfaces of cap wafer 105. With such embodiments, the bottom of device wafer 102 may be ground down to reduce thickness after wafer bonding.

One embodiment of the present invention includes a method for electrically coupling a first wafer with a second wafer. The method includes bonding the first wafer with the second wafer, forming an opening in the first wafer in a scribe area of the second wafer to expose a surface of a conductive structure of the second wafer, and forming a conductive layer overlying the first wafer and the opening in the first wafer such that the conductive layer forms an electrical contact with the conductive structure of the second wafer thereby electrically coupling the first wafer with the second wafer.

Another embodiment includes a method for electrically coupling a cap wafer with a device wafer. The method includes bonding the cap wafer with the device wafer using a bonding material. The device wafer includes a substrate. The method includes forming an opening in the cap wafer and the bonding material in a scribe area of the device wafer to expose a surface of a conductive structure of the device wafer. The forming the opening through the cap wafer and the bonding material includes sawing through the cap wafer and the bonding material in the scribe area of the device wafer. The method includes forming a conductive layer overlying the cap wafer and the opening in the cap wafer such that the conductive layer forms an electrical contact with the conductive structure of the device wafer thereby electrically coupling the cap wafer with the device wafer.

Another embodiment includes a method for electrically coupling a first wafer with a second wafer. The method includes bonding the first wafer with the second wafer using a bonding material, forming an opening in the first wafer and the bonding material in a scribe area of the second wafer to expose a surface of a conductive structure of the second wafer, and forming a conductive layer overlying the first wafer and the opening in the first wafer such that the conductive layer forms an electrical contact with the conductive structure of the second wafer thereby electrically coupling the first wafer with the second wafer. The method includes separating the bonded wafers into a plurality of die. The separating includes removing material of a separation path of the second wafer, the separation path having a first width. The opening has a second width, and the first width and the second width are selected such that at least one portion of the conductive layer remains on at least one sidewall of a separated die and thereby provides electrical coupling between the first wafer and the second wafer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for electrically coupling a first wafer with a second wafer, the method comprising:
   bonding the first wafer with the second wafer;
   forming an opening in the first wafer in a scribe area of the second wafer to expose a surface of a conductive structure of the second wafer; and
   forming a conductive layer overlying the first wafer and the opening in the first wafer such that the conductive layer forms an electrical contact with the conductive structure of the second wafer thereby electrically coupling the first wafer with the second wafer,
   wherein the bonding the first wafer with the second wafer includes bonding the first wafer with the second wafer using a bonding material, wherein the forming the opening includes forming an opening in the bonding material.

2. The method of claim 1, wherein forming the opening through the first wafer comprises sawing through the first wafer in the scribe area of the second wafer.

3. The method of claim 1, wherein the second wafer comprises at least one micro-electro-mechanical systems (MEMS) device.

4. The method of claim 1 further comprising sawing through the second wafer to separate the bonded first and second wafers into a plurality of die, wherein the sawing includes sawing through a saw path in the scribe area.

5. A method for electrically coupling a first wafer with a second wafer, the method comprising:
   bonding the first wafer with the second wafer;
   forming an opening in the first wafer in a scribe area of the second wafer to expose a surface of a conductive structure of the second wafer; and
   forming a conductive layer overlying the first wafer and the opening in the first wafer such that the conductive layer forms an electrical contact with the conductive structure of the second wafer thereby electrically coupling the first wafer with the second wafer,
   wherein the second wafer comprises a plurality of pads and the method further comprising forming a second opening in the first wafer to expose the plurality of pads, after the forming the opening in the first wafer.

6. The method of claim 5, wherein the bonding the first wafer with the second wafer includes bonding the first wafer with the second wafer using a bonding material, wherein the forming the opening includes forming an opening in the bonding material.

7. A method for electrically coupling a first wafer with a second wafer, the method comprising:
   bonding the first wafer with the second wafer;
   forming an opening in the first wafer in a scribe area of the second wafer to expose a surface of a conductive structure of the second wafer;
   forming a conductive layer overlying the first wafer and the opening in the first wafer such that the conductive layer forms an electrical contact with the conductive structure of the second wafer thereby electrically coupling the first wafer with the second wafer; and
   separating the bonded first and second wafers into a plurality of die, wherein the separating includes removing material of a separation path of the second wafer, the separation path having a first width, wherein the opening has a second width, and wherein the first width and the second width are selected such that at least one portion of the conductive layer remains on at least one sidewall of a separated die and thereby provides electrical coupling between the first wafer and the second wafer.

8. The method of claim 7, wherein the second width is wider than the first width.

9. A method for electrically coupling a cap wafer with a device wafer, the method comprising:
   bonding the cap wafer with the device wafer using a bonding material, wherein the device wafer comprises a substrate;
   forming an opening in the cap wafer and the bonding material in a scribe area of the device wafer to expose a surface of a conductive structure of the device wafer, wherein forming the opening through the cap wafer and the bonding material comprises sawing through the cap wafer and the bonding material in the scribe area of the device wafer; and forming a conductive layer overlying the cap wafer and the opening in the cap wafer such that the conductive layer forms an electrical contact with the conductive structure of the device wafer thereby electrically coupling the cap wafer with the device wafer.

10. The method of claim 9, wherein the device wafer comprises a plurality of pads and the method further comprising forming a second opening in the cap wafer to expose the plurality of pads after forming the opening in the cap wafer.

11. The method of claim 9, wherein the device wafer comprises at least one micro-electro-mechanical systems (MEMS) device.

12. The method of claim 9 further comprising sawing through the device wafer to separate bonded wafers into a plurality of die and wherein each of the plurality of die comprises at least one micro-electro-mechanical systems (MEMS) device.

13. The method of claim 9 further comprising separating the bonded wafers into a plurality of die, wherein the separating includes removing material of a separation path of the device wafer in the scribe area, the separation path having a first width, wherein the opening has a second width, and wherein the first width and the second width are selected such that at least one portion of the conductive layer remains on at least one sidewall of a separated die and thereby continues to provide electrical coupling between the cap wafer and the device wafer.

14. The method of claim 9, wherein the bonding material is non-conductive.

15. The method of claim 14, wherein the non-conductive bonding material is glass frit.

16. A method for electrically coupling a first wafer with a second wafer, the method comprising:

bonding the first wafer with the second wafer using a bonding material to form bonded wafers;

forming an opening in the first wafer and the bonding material in a scribe area of the second wafer to expose a surface of a conductive structure of the second wafer;

forming a conductive layer overlying the first wafer and the opening in the first wafer such that the conductive layer forms an electrical contact with the conductive structure of the second wafer thereby electrically coupling the first wafer with the second wafer; and separating the bonded wafers into a plurality of die, wherein the separating includes removing material of a separation path of the second wafer, the separation path having a first width, wherein the opening has a second width, and wherein the first width and the second width are selected such that at least one portion of the conductive layer remains on at least one sidewall of a separated die and thereby provides an electrical coupling between the first wafer and the second wafer.

17. The method of claim 16, wherein the second wafer comprises a plurality of pads and the method further comprising forming a second opening in the first wafer to expose the plurality of pads after forming the opening in the first wafer.

18. The method of claim 16, wherein each of the plurality of die include a cavity defined by a surface of a structure of the first wafer and a surface of a structure of the second wafer.

19. The method of claim 18, wherein the second wafer comprises a plurality of micro-electro-mechanical systems (MEMS) devices.

20. The method of claim 16, wherein the bonding material is a non-conductive glass frit.

* * * * *